United States Patent [19]

Abele

[11] Patent Number: 5,107,239
[45] Date of Patent: Apr. 21, 1992

[54] HYBRID PERMANENT MAGNETS

[75] Inventor: Manlio G. Abele, New York, N.Y.

[73] Assignee: New York University, New York, N.Y.

[21] Appl. No.: 707,447

[22] Filed: May 30, 1991

[51] Int. Cl.⁵ .................................. H01F 7/02
[52] U.S. Cl. .......................... 335/306; 335/304
[58] Field of Search ............ 335/209, 210, 211, 212, 335/214, 296, 297, 298, 301, 302, 304, 306; 315/5.34, 5.35

[56] References Cited

U.S. PATENT DOCUMENTS

| | | | |
|---|---|---|---|
| 3,227,931 | 1/1966 | Adler | 335/306 |
| 3,768,054 | 10/1973 | Neugebauer | 335/304 |
| 4,810,986 | 3/1989 | Leupold | 335/301 |
| 4,994,777 | 2/1991 | Leupold et al. | 335/302 |
| 4,998,083 | 3/1991 | Abele | 335/302 |
| 5,034,715 | 7/1991 | Leupold et al. | 335/306 |

Primary Examiner—Leo P. Picard
Assistant Examiner—Ramon M. Barrera
Attorney, Agent, or Firm—Rosen, Dainow & Jacobs

[57] ABSTRACT

Magnetized transition elements are provided between the magnetized elements that define the cavity of the structure. The magnitudes and directions of the fields of these transition elements are arranged so that the external boundary of the transition elements are equipotential surfaces, and the induction in the transition elements is zero. Separate return yokes are provided for the magnetized elements adjacent the transition elements, that do not contact the transition elements.

5 Claims, 10 Drawing Sheets

HYBRID PERMANENT MAGNETS

This invention relates to hybrid magnetic structures, i.e. magnetic structures wherein at least a part of the structure is provided with a yoke and at least another part of the structure is yokeless.

BACKGROUND OF THE INVENTION

Permanent magnetic structures, for example for the generation of a uniform magnetic field in a cavity, are known. Such structures are described, for example, in my publication "Optimum Design of Two-Dimensional Permanent Magnets", T.R. 21, NYU Medical Center, NYU School of Medicine, Oct. 15, 1989, and magnetic structures of this type that require yokes are described, for example, in my copending U.S. Pat. Application Ser. No. 07/591,458, filed Oct. 1, 1990.

In the design of such yoked magnets, it is sometimes inconvenient to provide means for accessing the cavity in the magnetic structure.

SUMMARY OF THE INVENTION

The present invention is directed to the provision of a magnetic structure of the hybrid type, wherein a yoke is provided for a part of the structure, and the remainder thereof is yokeless. It has been found that such an arrangement provides certain advantages, such as simplifying the access to the cavity of the magnetic structure.

Briefly stated, in accordance with the invention. magnetized transition elements are provided between the magnetized elements that define the cavity of the structure. The magnitudes and directions of the fields of these transition elements are arranged so that the external boundary of the transition elements are equipotential surfaces, and the induction in the transition elements is equal to zero.

BRIEF DESCRIPTION OF THE DRAWING

In order that the invention may be more clearly understood, it will now be disclosed in greater detail with reference to the accompanying drawings, wherein.

DETAILED DISCLOSURE OF THE INVENTION

A uniform magnetic field can always be generated within a prismatic cavity of arbitrary geometry by means of a structure of uniformly magnetized prisms that enclose the cavity. In such a cavity, one face of each prism coincides with one face of the prismatic cavity, and another face of each prism coincides with the internal surface of an external yoke of high magnetic permeability that totally encloses the magnetic structure.

Figure 1:
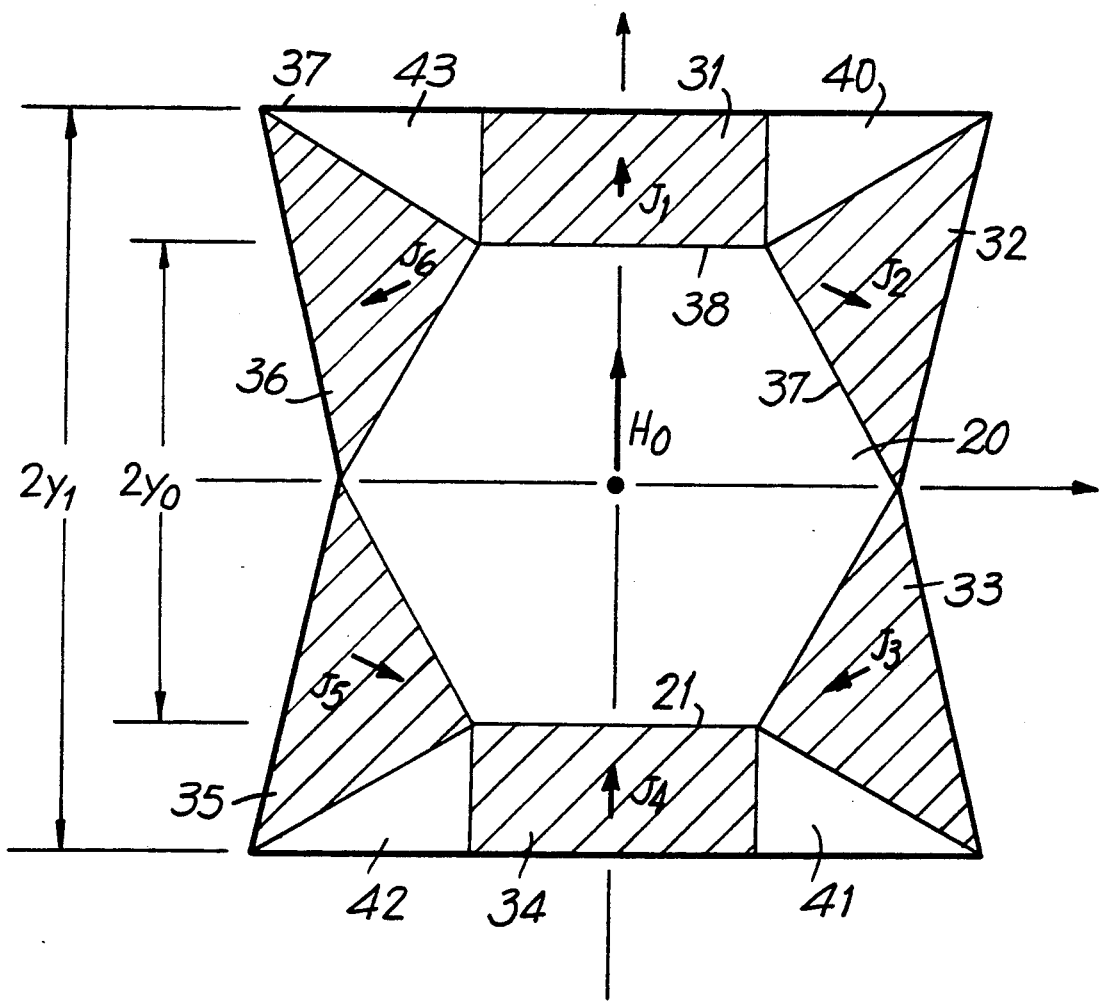
FIG. 1 is a cross sectional view of a conventional yoked magnetic structure.

An example of a yoked magnet composed of uniformly magnetized prisms is shown in FIG. 1 in the particular case of a prismatic cavity 20 with a regular hexagonal cross section. The intensity $\vec{H}_O$ of the uniform magnetic field within the cavity 20 of FIG. 1 is perpendicular to a face 21 of the cavity and the remanences $\vec{J}_i$ ($i=1,2,3,4,5$) of the magnetized prisms 31, 32, 33, 34, 35, 36, respectively, have the same magnitude $J_O$. The heavy line in FIG. 1 represents the internal boundary of the magnetic yoke 37. The height $2y_l$ of the magnetic structure is related to the dimension $2y_O$ of the hexagonal cavity between the opposite faces 21, 38, by the equation;

$$\frac{y_0}{y_1} = 1 - K \tag{1}$$

where K is a design parameter defined by:

$$K = \frac{\mu_0 H_0}{J_0} \tag{2}$$

where in MKS units $\mu_O = 4 \cdot 10^{-7}$ H/m.

Figure 2:
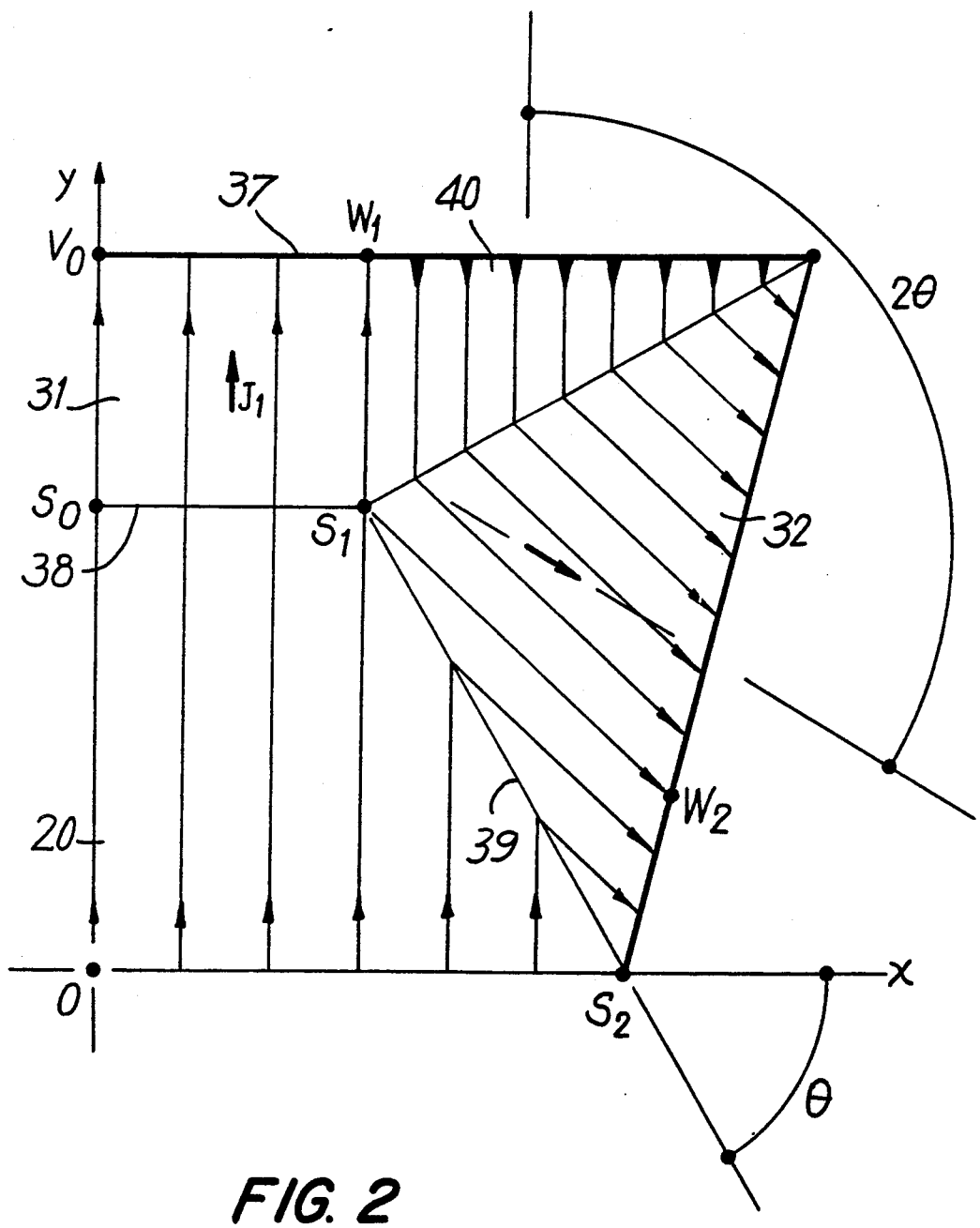
FIG. 2 is an illustration of the lines of force of the magnetic induction in a quadrant of the structure of FIG. 1.

The first quadrant of the magnet cross section of FIG. 1 is shown in FIG. 2. Remanence $\vec{J}_1$ is parallel to the axis y and remanence $\vec{J}_2$ is oriented at an angle $2\Theta$ with respect to the y axis, where $\Theta$ is the angle between axis x and the interface 39 between the cavity and the prism 32 with remanence $\vec{J}_2$. In the particular example of the regular hexagonal cavity of FIG. 1:

$$2\Theta = \frac{2\pi}{3} \tag{3}$$

A characteristic feature of the yoked magnets of the type of FIG. 1 is the presence of the triangular areas 40, 41, 42, 43 of either air or "non-" magnetic material that separate the magnetized prisms. For example, in FIG. 2, the two prisms 31 ($S_0$ $S_1$ $W_1$ $V_0$) and 32 ($S_1$ $S_2$ $V_1$) are separated by the "non" magnetic region ($S_1$ $V_1$ $W_1$)

FIG. 2 shows the lines of flux of the magnetic induction:

$$\vec{B} = \vec{J} + \mu_0 \vec{H} \tag{4}$$

The flux of $\vec{B}$ within the cavity 20 reaches the external yoke 37 in the quadrant of FIG. 2 only within the two segments ($V_O W_1$) and ($S_2 W_2$). Within the area ($S_1 W_2 V_1 W_1$), i.e. the area 40 and a portion of the area 32, the flux $\vec{B}$ circulates between the yoke and the magnetic structure outside of the cavity. In other words the area ($S_1 W_2 V_1$) of the prism 32 of remanence $\vec{J}_2$ does not contribute to the flux of $\vec{B}$ within the cavity, and represents a waste of the energy stored in the magnetic material of the yoked magnet. This situation is similar to the fringe field area of a conventional permanent magnet where a fraction of the energy stored in the magnetic material is wasted outside of the region of interest.

Figure 3:
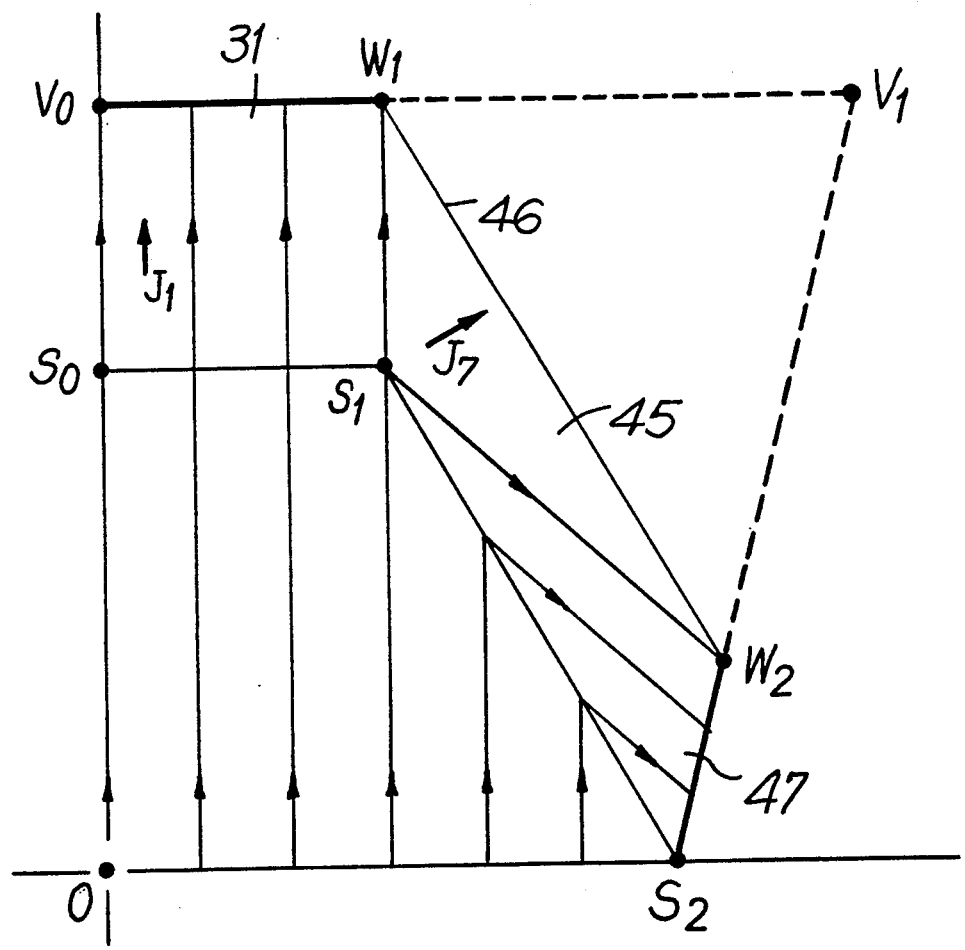
FIG. 3 is an illustration of a quadrant of a magnetic structure in accordance with the invention.

Assume that the area ($S_1 W_2 V_1$) of the prism 32 of remanence $\vec{J}_2$ is eliminated, and a new component 45 of magnetic material of remanence $\vec{J}_7$ and cross sectional area ($S_1 W_2 W_1$) is inserted in the magnetic structure as shown in FIG. 3. Remanence $\vec{J}_7$ is oriented in the direction perpendicular to the side ($W_1 W_2$) and satisfies the condition:

$$\vec{J}_7 = -\mu_0 \vec{H}_7 \quad (5)$$

where $\vec{H}_7$ is the intensity in the area ($S_1 W_2 W_1$). Thus the magnetization of the new component 45 is such that no flux of $\vec{B}$ is generated in the area ($S_1 W_2 W_1$). The two media 31, 47 are limited by surfaces which are parallel to the magnetic induction in the respective medium, and the transition between these two media is effected by a body of remanence $\vec{J}_7$.

Boundary 46 ($W_1 W_2$) of the new component of remanence $\vec{J}_7$ is an equipotential surface with the same potential as the magnet yoke. By definition, $\vec{B}$ is zero in the area ($S_1 W_2 W_1$) and, as a consequence, boundary 46 ($W_1 W_2$) can be the interface between the medium of remanence $\vec{J}_7$ and the external "non"-magnetic medium. Thus, in the ideal limit of infinite magnetic permeability, one can arbitrarily select the geometry of the external yoke of the magnet, as long as it closes the flux $\vec{B}$ generated by the magnetic structure.

Figure 4:
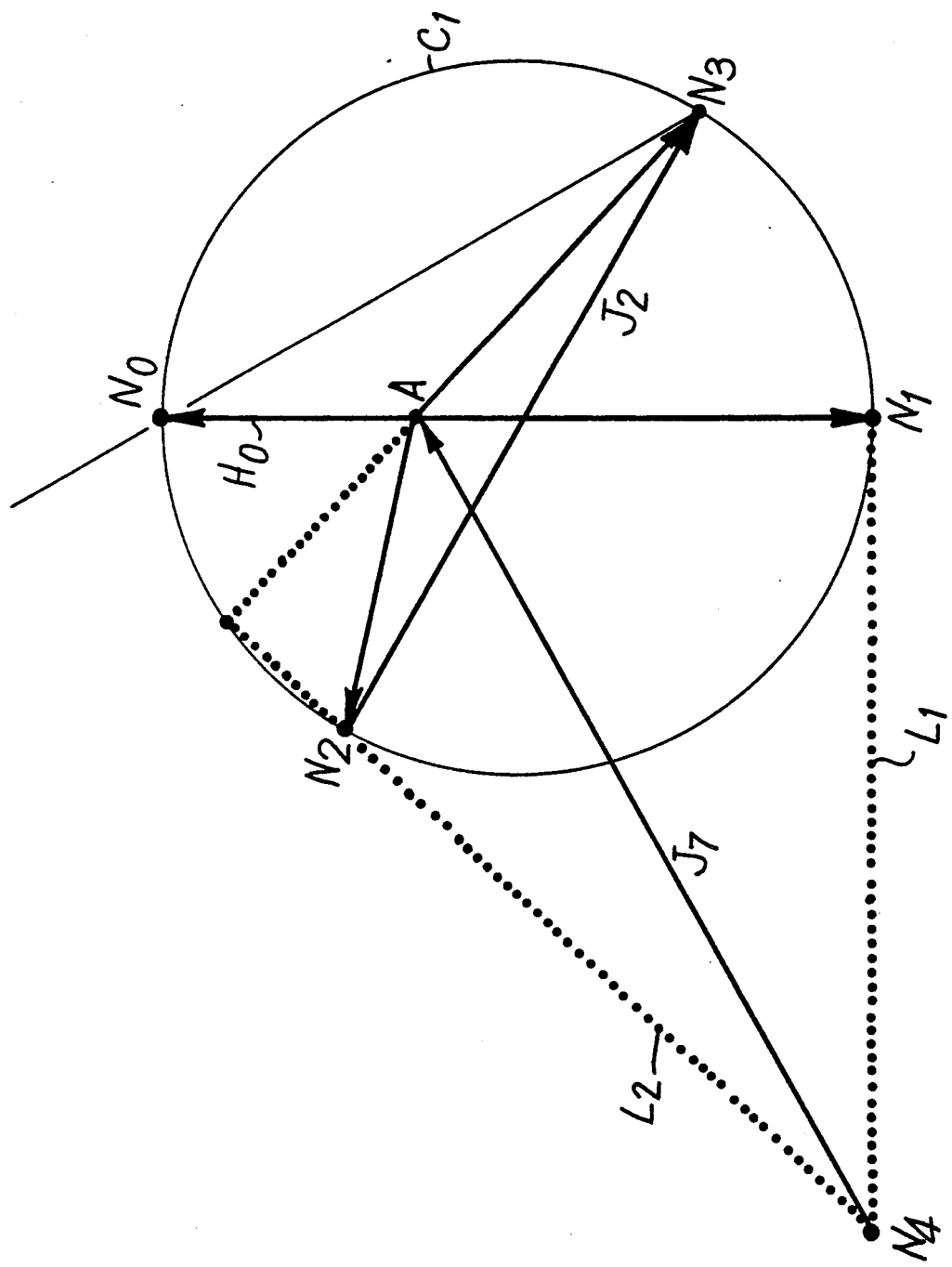
FIG. 4 is a vector diagram illustrating the determination of parameters of the structure of FIG. 3.

The magnitude of remanence $\vec{J}_7$ is determined by the vector diagram of FIG. 4.

FIG. 4 is a vector diagram illustrating the conditions existing in the arrangement of FIG. 3. FIG. 4 is a particular case of the general technique for determining the parameters of a magnetic structure. In this figure, circle $C_1$ has a diameter corresponding to the magnitude of the magnetization $\vec{J}_7$, the vector $\vec{J}_1$ *l corresponding to the direction between the diametrically opposite point* $N_1$ and $N_0$ on the circle $C_1$. A point A is located on the line $N_1 N_0$, such that the vector $AN_0$ corresponds to the intensity of the field $H_0$ generated in the cavity. The vector $AN_1$, is oriented in the direction opposite to vector $AN_0$, and this vector corresponds to $H_1$, the intensity in the region 31 of remanence $\vec{J}_1$.

A vector $AN_2$ is constructed to a point on the circle $C_1$ corresponding to the intensity of the field in the region of remanence $J_2$, and a diameter $N_2 N_3$ is drawn in the circle, corresponding to the remanence of the material $J_2$. (The magnitude of the remanence $J_2$ must be equal in magnitude $J_1$. The magnitude and direction of the vector $AN_3$ correspond to the induction in the region of remanence $J_2$).

A line $L_1$ is constructed perpendicular to the line $N_1 N_0$ at the point $N_1$, and a line $L_2$ is constructed perpendicular to $AN_3$ at the point $N_2$. The intersection $N_4$ of lines $L_1$ and $L_2$ is the origin of vector $\vec{J}_7$ whose tip coincides with point A.

The vector $\vec{J}_7$ is oriented perpendicular to side ($W_1 W_2$) of the new component 45 and, in general, its magnitude is different from $J_0$. Only in the particular case:

$$K = \tfrac{1}{2} \quad (6)$$

one has:

$$J_7 = J_0 \quad (7)$$

Figure 5:
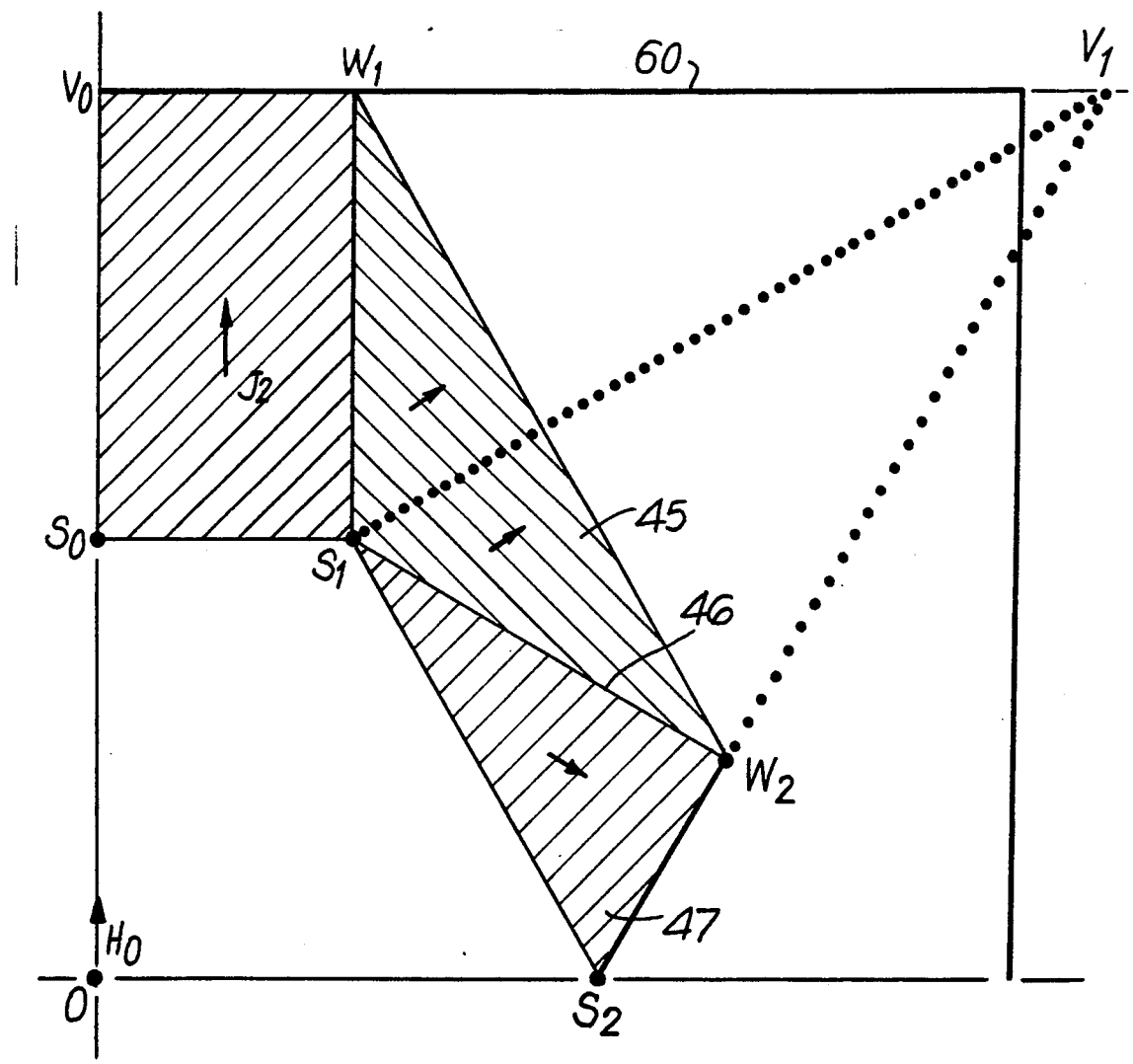
FIG. 5 is a cross sectional view of a quadrant of a magnetic structure according to FIG. 3, and including a designation of a yoke for a portion thereof.

In this case, the magnetic structure in the first quadrant has the geometry shown in FIG. 5 wherein, by virtue of Eq. 1:

$$y_0/y_1 = \tfrac{1}{2} \quad (8)$$

In FIG. 5, a rectangular shape has been selected for the external yoke 60 of the magnet which does not contact the ($S_2 W_2$) boundary of the magnetized prism 47 of remanence $\vec{J}_2$. Thus the fluxes of $\vec{B}$ across segments ($V_0 W_1$) and ($S_2 W_2$) can be closed through the fourth quadrant of the magnet cross-section independently of one another. The dotted lines ($S_1 V_1$) and ($S_2 V_1$) in FIG. 5 correspond to the triangular component of remanence $\vec{J}_2$ of the original yoked structure of FIG. 1. The reduction in the area of magnetized material resulting from the insertion of the component of remanence $\vec{J}_7$ is quite apparent.

The replacement of region ($S_1 W_2 V_1 W_1$) of the yoked magnet with components of a yokeless structure can be done using a magnetic material that has the same remanence $J_0$ as the rest of the magnet. This results in the structure of FIG. 6 comprised of the two elements 61 ($S_1 W_3 W_1$) and 62 ($S_1 W_2 W_3$) of remanence $\vec{J}_8$ and $\vec{J}_9$ whose magnitude is equal to $J_0$. The calculation of the directions of $\vec{J}_8$ and $\vec{J}_9$ is illustrated by the vector diagram of FIG. 7.

Since the remanences $\vec{J}_8$ and $\vec{J}_9$ have the magnitude $J_0$, a circle $C_2$ of radius $J_0$ is drawn with a center at the point A. The line $L_1$ intersects the circle $C_2$ at point $N_8$ and the line $L_2$ intersects the circle $C_2$ at point $N_9$. The vector $N_8 A$ now corresponds in direction and magnitude to the remanence $\vec{J}_8$, and the vector $N_9 A$ corresponds in direction and magnitude to the remanence $\vec{J}_9$.

The remanences $\vec{J}_8$ and $\vec{J}_9$ are perpendicular to sides ($W_1 W_3$) and ($W_3 W_2$) respectively and they satisfy the conditions:

$$\vec{J}_8 = -\mu \vec{H}_8 \text{ and } \vec{J}_9 = -\mu \vec{H}_9 \quad (9)$$

where $\vec{H}_8$ and $\vec{H}^9$ are the intensities within the two yokeless components. Again the dotted lines in FIG. 7 emphasize the reduction of the area of magnetized material resulting from the elimination of the cut wedges of known yoked magnets.

When the points $W_1$, $W_2$ are joined to form a single triangle, the magnitude of $\vec{J}_7$ *l must be different from* $J_0$, in general. Only in the particular case when $K = \tfrac{1}{2}$, can the magnitude of $\vec{J}_7$ be equal to $J_0$, to provide the arrangement of FIG. 5 wherein the external interface is straight. If it is desired to build the transition unit with a medium which has the same magnitude $J_0$ as the rest of the magnetic structure, then the transition in general cannot have the shape of single triangle, that is, two triangular sections are needed as shown in FIG. 6.

Figure 6:
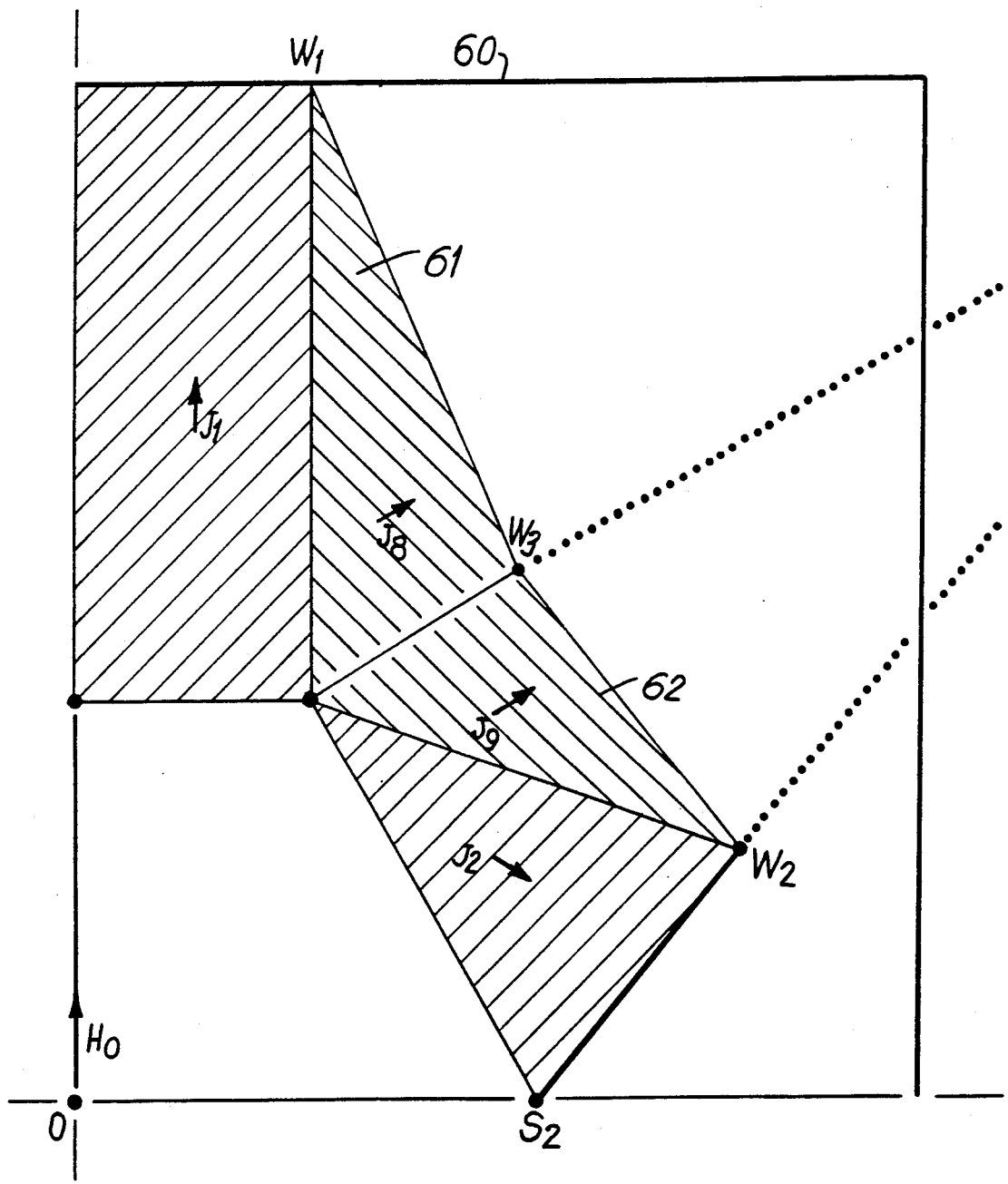
FIG. 6 is a cross sectional view of a quadrant of a magnetic structure that is a modification of the structure of FIG. 5.
Figure 7:
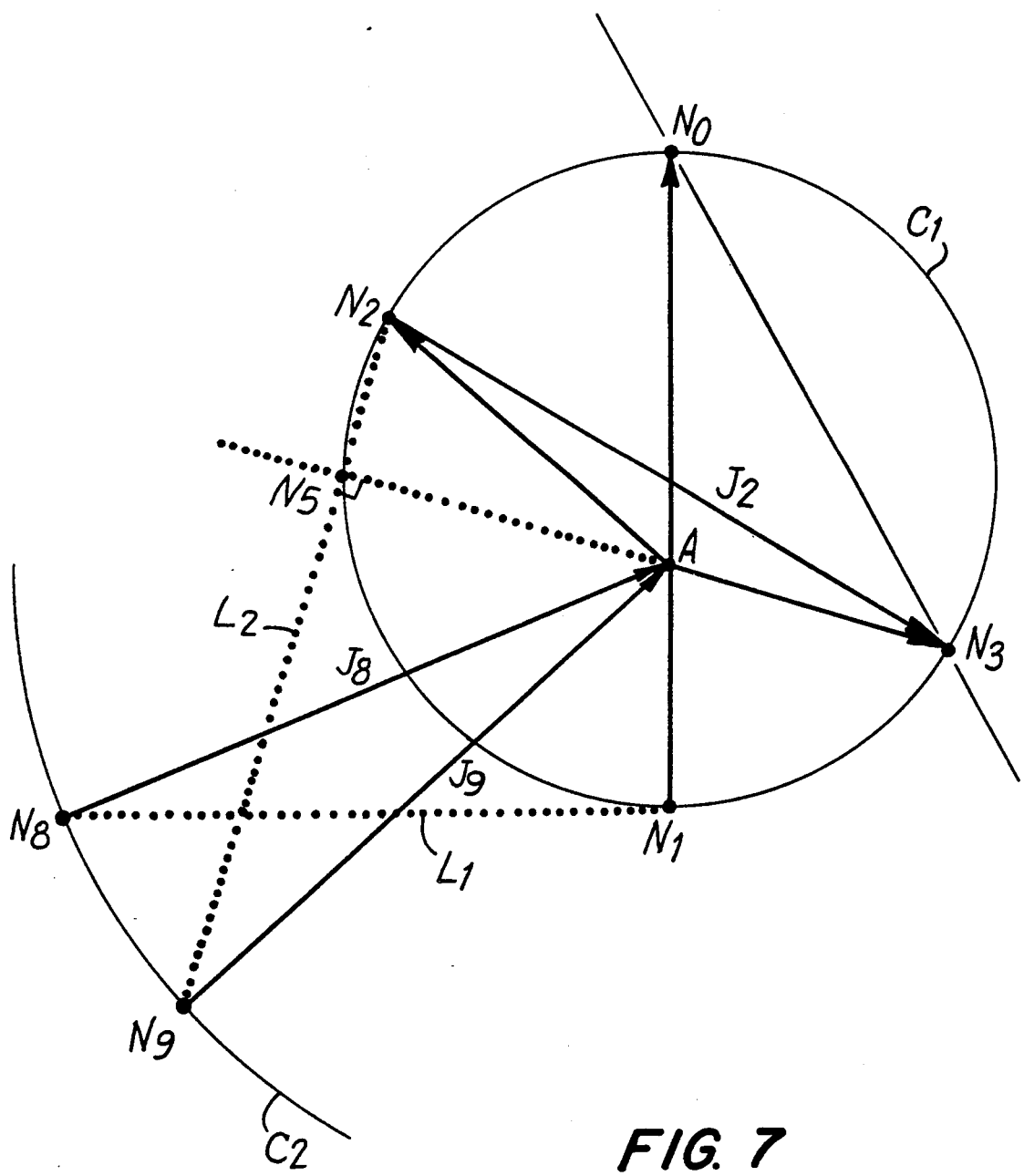
FIG. 7 is a vector diagram illustrating the determination of parameters of the structure of FIG. 6.
Figure 8:
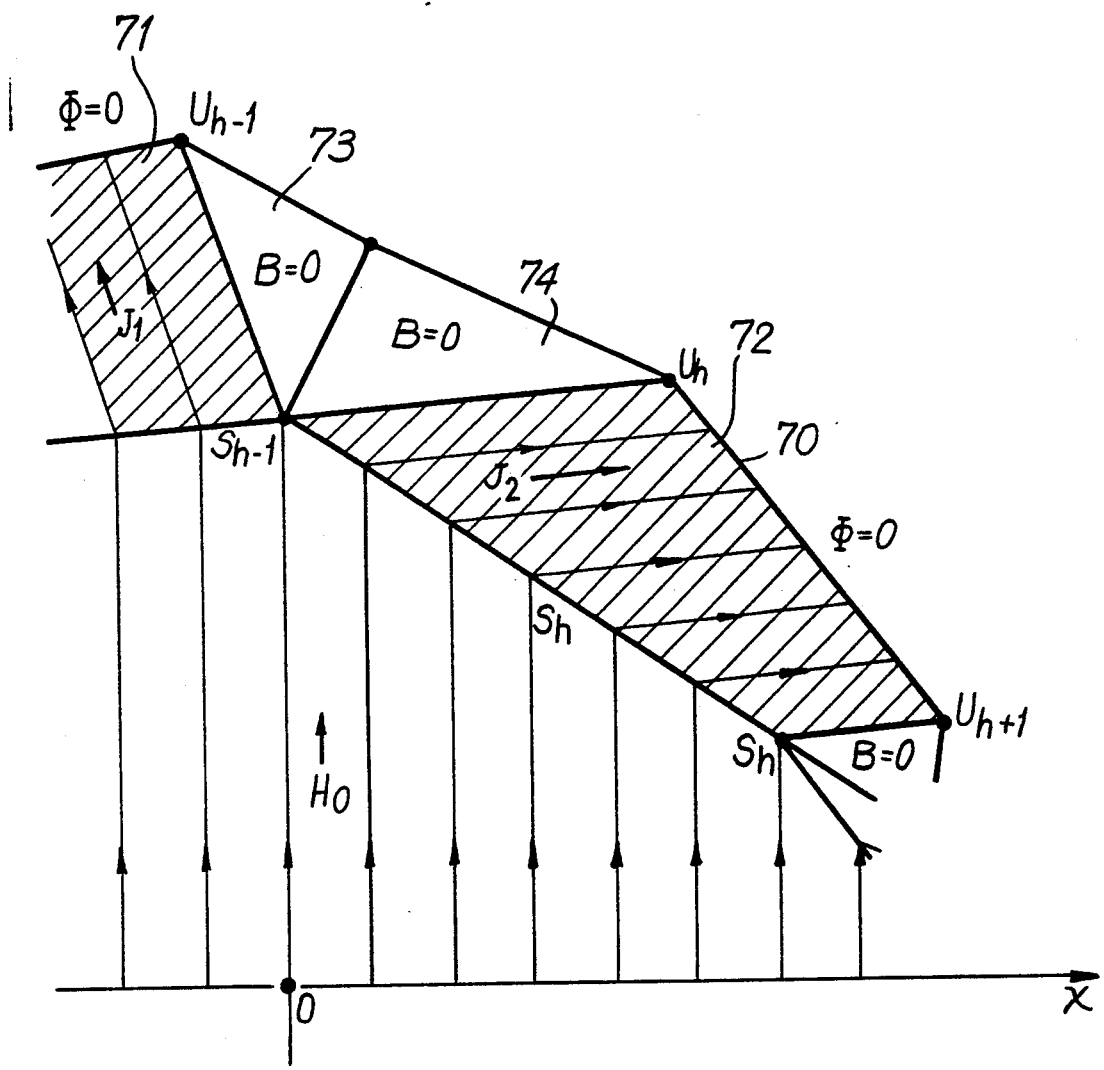
FIG. 8 illustrates a cross section of a magnetic structure, for explaining the general case of the invention.

FIGS. 5 and 6 represent particular cases of the structure in accordance with the invention. In a general case, this principle can be expanded, as will be explained with reference to FIG. 8. In general, when a yoked structure is designed around a polygonal boundary of the cavity, each element of magnetized material which carries a fraction of the flux which flows into the cavity is in a general case a quadrangle limited on one side by the interface with the cavity, represented by the side ($S_{h-1} S_h$) in FIG. 8. The other side of the element is limited by an equipotential line of zero potential, which constitutes the interface with the yoke 70, i.e. the line ($U_h U_{h+1}$) The other two sides, ($S_{h-1} U_h$) and ($S_h$ *pl* $U_{h+1}$) are parallel to one another and parallel to the magnetic induction in that element of magnetized material. Consequently all of the magnetized materials that interface with the cavity have this form. In the particular case where point $U_{h+1}$ collapses to the point $S_h$, as in the arrangement of FIG. 3, the quadrangle becomes a triangle.

The external boundaries of all the magnetized material elements, such as the elements 71 and 72, are joined together by transition elements, such as the elements 73, 74, which satisfy the condition that, inside the respective transition element, the induction is equal to zero. Since the magnetic induction is zero, the intensity of the magnetic field is equal and opposite to the magnetization.

In the most general formulation of the magnetic structure, the external boundary of the elements of magnetized material which carry the flux in the cavity must be confined by a magnetic yoke, i.e. by a body of infinite or very high permeability. All of the transition elements, such as the transition element ($S_{h-1}$ 1 $U_h$ $U_{h-1}$), where the induction is equal to zero and where the external boundary is by definition an equipotential surface of zero potential, do not need any yoke to confine the field, so the boundary of the respective transition unit can be directly interfaced with the external medium, such as air.

The flux which goes into the cavity and into the magnetized elements and thence into a yoke must close somewhere. With respect to these elements, the yoke should close the magnetic path in a manner symmetrical with respect to the plane $y = 0$. There is no reason, however, in accordance with the invention, for requiring a single yoke which interfaces with all of the magnetized components. Consequently, in accordance with the invention, a hybrid magnetic structure can be provided having a plurality of independent yokes.

Figure 9:
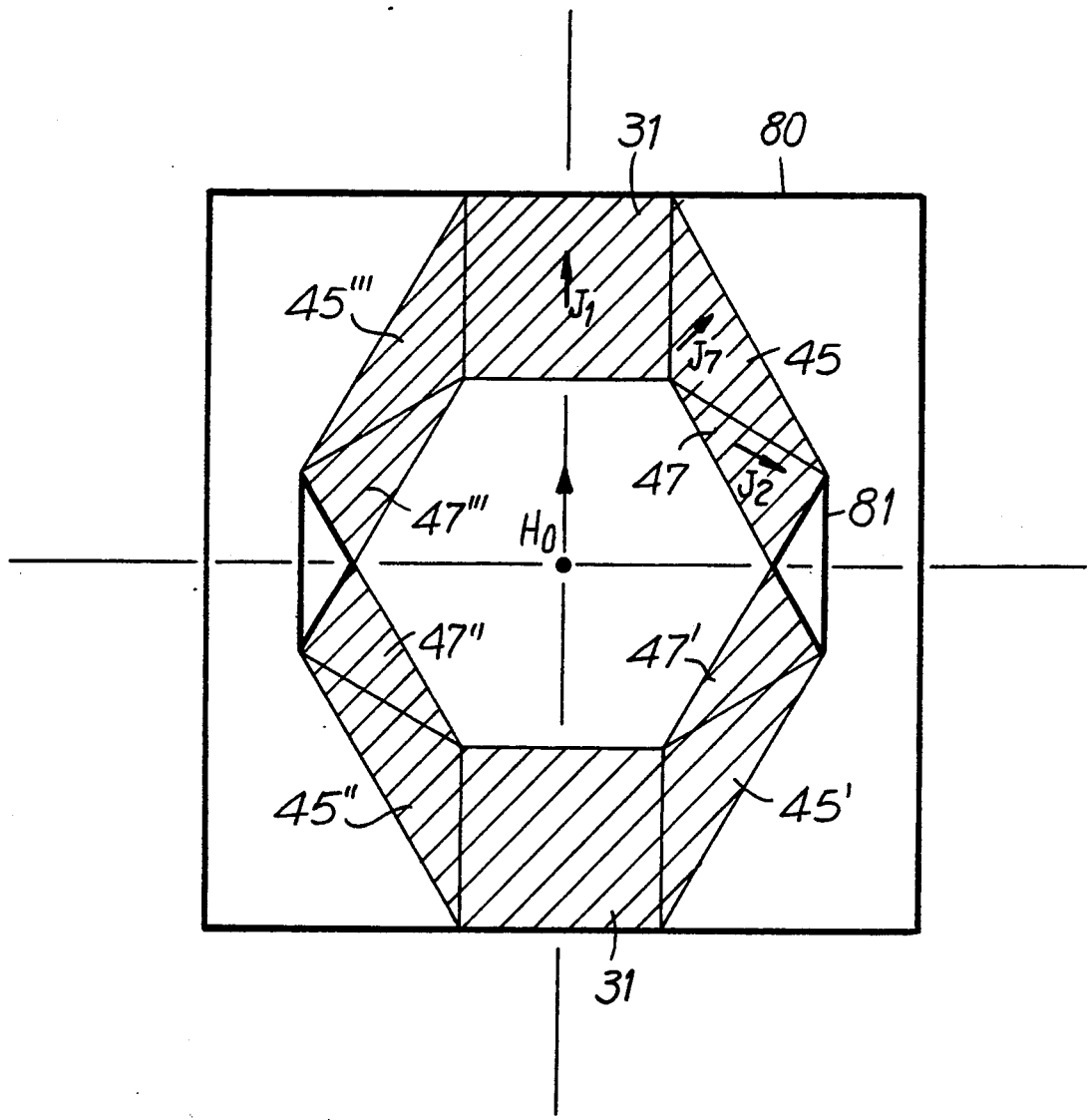
FIG. 9 is a cross sectional view of a hybrid structure in accordance with the invention, illustrating the use of independent yokes.

For example, FIG. 9 illustrates the cross section of a complete magnetic structure corresponding to the quadrant thereof illustrated in FIG. 3, wherein the magnetized elements in the second, third and fourth quadrants are identified by reference numerals common to those of the first quadrant, but with prime, double prime, and triple prime marks, respectively. In this structure, one yoke 80 is positioned to close the magnetic path between the opposite magnetized element, thereby completely surrounding the structure but not contacting the other magnetized elements, so as to be symmetric with respect to the plane $y = 0$. A separate independent yoke 81 is provided, also symmetric with respect to the plane $y = 0$, forming a return path between the elements 47', 47''' and the elements 47', 47''. No yoke is provided for the elements 45, 45', 45'' and 45'''.

Figure 10:
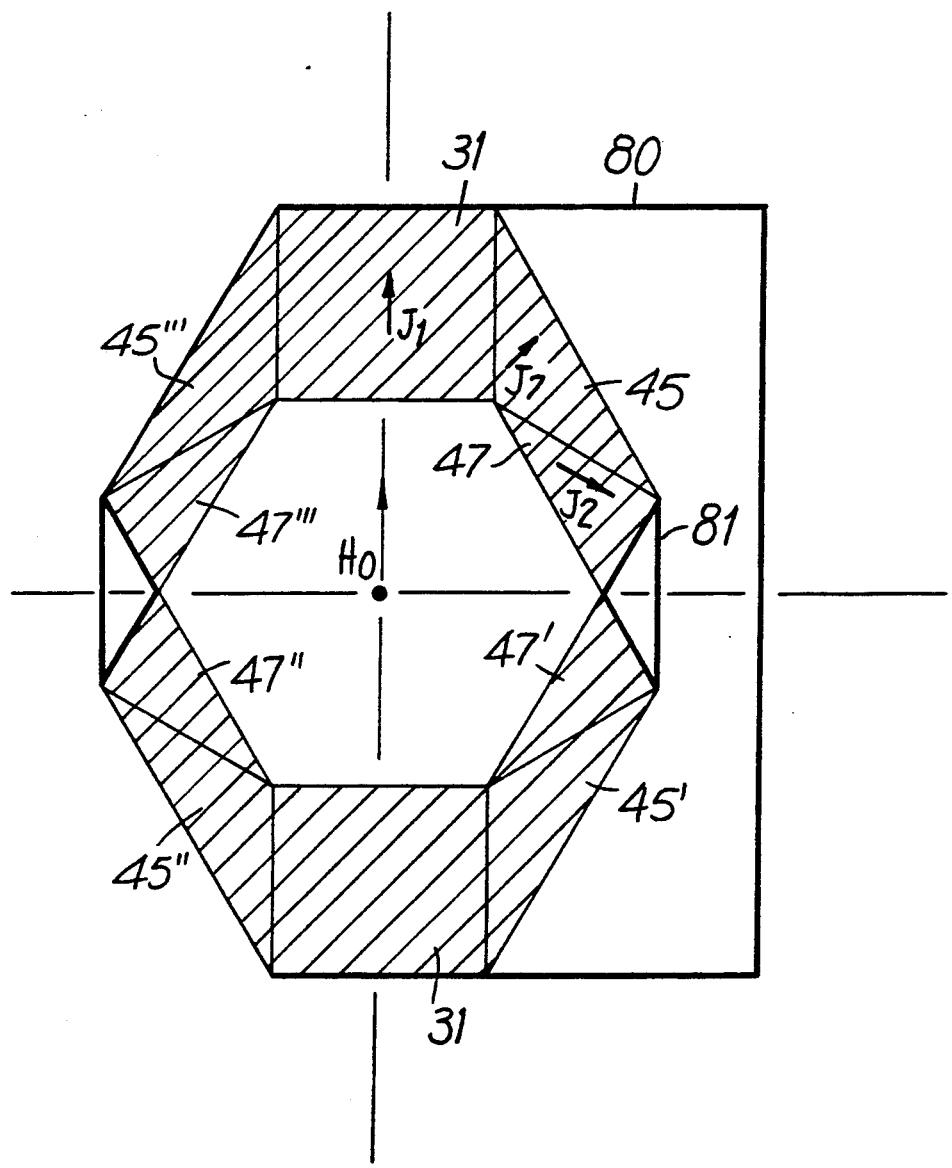
FIG. 10 is the cross sectional view of a modification of the structure of FIG. 9.

The geometrical shape of the yokes is not of importance, since the permeability thereof is extremely high. For example, each of the yokes can extend around the perimeter of the magnetic structure, as illustrated in FIG. 9. Alternatively, as illustrated in FIG. 10, for example, the yoke may be shaped to extend around one side of the magnetic structure The yoke doesn't have to close on any specific side of the structure.

This arrangement permits the provision of an open structure. Since the transition elements are magnetically transparent, the cavity can interact with effects external thereof without breaking and entering the magnetic structure. Such a feature is not possible with the yoked arrangement of the prior art, as illustrated in FIG. 1.

While the invention has been disclosed and described with reference to a single embodiment, it will be apparent that variations and modifications may be made therein, and it is therefore intended in the following claims to cover each such variation and modification as falls within the true spirit and scope of the invention.

What is claimed is:

1. In a magnet structure having a plurality of magnetized prisms arranged with flat sides defining the sides of a cavity, for providing a uniform magnetic field in the cavity, the improvement wherein said magnetized prisms are shaped to have substantially no regions that do not contribute to flux in said cavity, and further comprising magnetized transition elements between said magnetized prisms, said transition elements being positioned so that they do not define sides of said cavity, whereby a part of the external surface of said structure is defined by said transition elements, the magnitude and directions of the fields of said transition elements producing an equipotential surface at the external surface thereof, the induction in said transition elements being equal to zero, said structure further comprising a plurality of separate yokes coupled between predetermined ones of said prisms and not contacting said transition elements.

2. The magnetic structure of claim 1 wherein said prisms are triangular prisms.

3. The magnetic structure of claim 2 wherein said transition elements are triangular prism shaped.

4. The magnetic structure of claim 3 wherein a single transition element is positioned between each pair of adjacent said prisms.

5. The magnetic structure of claim 3 wherein two transition elements are positioned between each pair of adjacent said prisms.

* * * * *